(12) United States Patent
Behringer (10) Patent No.: US 11,205,643 B2
(45) Date of Patent: Dec. 21, 2021

(54) OPTOELECTRONIC CIRCUIT ASSEMBLY AND METHOD FOR REPAIRING AN OPTOELECTRONIC CIRCUIT ASSEMBLY

(71) Applicant: OSRAM OLED GmbH, Regensburg (DE)

(72) Inventor: Martin Behringer, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/964,339

(22) PCT Filed: Jan. 29, 2019

(86) PCT No.: PCT/EP2019/052102
§ 371 (c)(1),
(2) Date: Jul. 23, 2020

(87) PCT Pub. No.: WO2019/149690
PCT Pub. Date: Aug. 8, 2019

(65) Prior Publication Data
US 2021/0057391 A1    Feb. 25, 2021

(30) Foreign Application Priority Data

Jan. 30, 2018    (DE) ............... 10 2018 102 044.9

(51) Int. Cl.
*H01L 25/075*    (2006.01)
*G09G 3/32*    (2016.01)
*H01L 23/538*    (2006.01)

(52) U.S. Cl.
CPC .......... *H01L 25/0753* (2013.01); *G09G 3/32* (2013.01); *H01L 23/5389* (2013.01); *G09G 2330/08* (2013.01)

(58) Field of Classification Search
CPC ... H01L 25/0753; H01L 22/22; H01L 25/167; H01L 33/62; G09G 3/32; G09G 2330/08
See application file for complete search history.

(56) References Cited

U.S. PATENT DOCUMENTS 8,791,474 B1 * 7/2014 Bibi ................. G09G 3/3208
257/89
10,043,788 B1    8/2018 Han
(Continued)

FOREIGN PATENT DOCUMENTS

CN    106684098 A    5/2017
WO    2008120132 A1    10/2008
(Continued)

OTHER PUBLICATIONS

Müller-Kirsch, Lutz, International Search Report and Written Opinion of the International Searching Authority, for counterpart application PCT/EP2019/052102, Apr. 17, 2019, European Patent Office, Rijswijk, The Netherlands, 11 pages.
(Continued)

*Primary Examiner* — Priyank J Shah
(74) *Attorney, Agent, or Firm* — Slater Matsil, LLP (57) ABSTRACT

An optoelectronic circuit assembly has a first optoelectronic component and a second optoelectronic component, wherein the optoelectronic components each comprise a housing body with an upper face and a lower face, wherein in the housing body of each optoelectronic component, a first optoelectronic semiconductor chip and a second optoelectronic semiconductor chip are embedded, wherein the optoelectronic components are mounted on a circuit board, wherein the first optoelectronic semiconductor chip of the first optoelectronic component and the first optoelectronic semiconductor chip of the second optoelectronic component are connected to a first conductor track in an electrically conductive manner, wherein the second optoelectronic semi-
(Continued)

conductor chip of the first optoelectronic component and the second optoelectronic semiconductor chip of the second optoelectronic component are connected to a second conductor track in an electrically conductive manner, wherein the first optoelectronic semiconductor chip or the second optoelectronic semiconductor chip of the first optoelectronic component is defective.

14 Claims, 3 Drawing Sheets

(56) References Cited

U.S. PATENT DOCUMENTS

| | | |
|---|---|---|
| 2017/0025075 A1 | 1/2017 | Cok et al. |
| 2017/0270852 A1 | 9/2017 | Meiti et al. |
| 2020/0013759 A1* | 1/2020 | Yoo .................... H01L 25/0753 |

FOREIGN PATENT DOCUMENTS

| | | |
|---|---|---|
| WO | 2014149864 A1 | 9/2014 |
| WO | 2016200635 A1 | 12/2016 |

OTHER PUBLICATIONS

Orth, Andreas, German Search Report for counterpart application DE 10 2018 102 044.9, May 25, 2018, German Patent and Trademark Office, Munich, Germany, 8 pages.

* cited by examiner

OPTOELECTRONIC CIRCUIT ASSEMBLY AND METHOD FOR REPAIRING AN OPTOELECTRONIC CIRCUIT ASSEMBLY

The present invention relates to an optoelectronic circuit assembly and a method for repairing an optoelectronic circuit assembly.

The present application is a National Stage application of, and claims priority, and the benefit of International Application No. PCT/EP2019/052102, filed Jan. 29, 2019, entitled "OPTOELEKTRONISCHE SCHALTUNGSANORDNUNG UND VERFAHREN ZUR REPARATUR EINER OPTOELEKTRONISCHEN SCHALTUNGSANORDNUNG", which claims priority, and the benefit of German patent application 10 2018 102 044.9, filed Jan. 30, 2018, entitled "OPTOELEKTRONISCHE SCHALTUNGSANORDNUNG UND VERFAHREN ZUR REPARATUR EINER OPTOELEKTRONISCHEN SCHALTUNGSANORDNUNG, each of which is hereby incorporated by reference.

Optoelectronic circuit assemblies are known which have optoelectronic components that are completely replaced in the event of a defect of individual elements of the optoelectronic component. Repair concepts for optoelectronic circuit assemblies are also known, in which a defective optoelectronic component is first removed and then replaced by a new one.

One of the objects of the present invention is to provide an optoelectronic circuit assembly. A further object of the present invention is to specify a method for repairing an optoelectronic circuit assembly. These objects are achieved by an optoelectronic circuit assembly and by a method having the features of the independent claims. The dependent claims contain various extensions of the invention.

An optoelectronic circuit assembly comprises a first optoelectronic component and a second optoelectronic component. The optoelectronic components each have a housing body with an upper face and a lower face. A first optoelectronic semiconductor chip and a second optoelectronic semiconductor chip are embedded in the body of each optoelectronic component. The optoelectronic components are mounted on a circuit board. The first optoelectronic semiconductor chip of the first optoelectronic component and the first optoelectronic semiconductor chip of the second optoelectronic component are connected to a first conductor track in an electrically conductive manner. The second optoelectronic semiconductor chip of the first optoelectronic component and the second optoelectronic semiconductor chip of the second optoelectronic component are connected to a second conductor track in an electrically conductive manner. The first optoelectronic semiconductor chip or the second optoelectronic semiconductor chip of the first optoelectronic component is defective.

This optoelectronic circuit assembly can be part of a display or a video wall, for example. In particular, the optoelectronic circuit assembly can form, for example, a picture element (pixel) of a display or a video wall. This circuit assembly has the advantage that the defect of the first optoelectronic semiconductor chip or the second optoelectronic semiconductor chip of the first optoelectronic component is compensated by the corresponding optoelectronic semiconductor chip of the second optoelectronic component. As a result, the optoelectronic circuit assembly remains fully functional despite the defect in one optoelectronic semiconductor chip of the first optoelectronic component.

In an embodiment of the optoelectronic circuit assembly, the first optoelectronic component and the second optoelectronic component have the same design. This advantageously enables the optoelectronic semiconductor chips of the second optoelectronic component to compensate completely for a defect in an optoelectronic semiconductor chip of the first optoelectronic component.

In an embodiment of the optoelectronic circuit assembly, the optoelectronic components each have a third optoelectronic semiconductor chip. The three optoelectronic semiconductor chips of the two optoelectronic components can be configured to emit light at wavelengths from different spectral ranges. For example, the three optoelectronic semiconductor chips of each optoelectronic component may be configured to emit light with a red, green, and blue color. In this case, the optoelectronic components may form light sources that emit light of adjustable color. Ideally, the adjustability of the color is fully maintained in this optoelectronic circuit assembly by the fact that the defect of the first optoelectronic component is compensated by the second optoelectronic component.

In one embodiment of the circuit assembly, a section of the conductor track connected to the defective optoelectronic semiconductor chip is severed between the first optoelectronic component and the second optoelectronic component. This will advantageously prevent electrical current from flowing through the defective optoelectronic semiconductor chip in the event of a short circuit in the defective optoelectronic semiconductor chip. This ensures that the optoelectronic semiconductor chip of the second optoelectronic device, which is compensating for the function of the defective optoelectronic semiconductor chip, is fed with the full electrical operating current and can thus radiate light with the desired brightness.

In one embodiment of the optoelectronic circuit assembly, the defective optoelectronic semiconductor chip is electrically passivated. The optoelectronic semiconductor chip can be electrically passivated, for example, by its epitaxial layer being completely or partially severed, or otherwise destroyed or removed. This will advantageously prevent electrical current from flowing through the defective optoelectronic semiconductor chip in the event of a short circuit in the defective optoelectronic semiconductor chip. This ensures that the optoelectronic semiconductor chip of the second optoelectronic component, which is compensating for the function of the defective optoelectronic semiconductor chip, is provided with the full operating current.

In one embodiment of the optoelectronic circuit assembly, the first optoelectronic component and the second optoelectronic component are arranged in parallel with one another on the circuit board. Ideally, this arrangement allows a simple parallel connection between the optoelectronic semiconductor chips of the first optoelectronic component and the optoelectronic semiconductor chips of the second optoelectronic component.

In one embodiment of the optoelectronic circuit assembly, the optoelectronic semiconductor chips of the first optoelectronic component are arranged in a row in the housing body. This advantageously makes it possible to arrange the conductor tracks in a straight line and parallel to one another on the printed circuit board. This makes it a simple matter to arrange the second optoelectronic component next to the first optoelectronic component on the circuit board in such a manner that the corresponding optoelectronic semiconductor chips of the two optoelectronic components are connected in parallel with one another.

In one embodiment of the optoelectronic circuit assembly, the optoelectronic semiconductor chips of the first optoelectronic component are arranged below one another and alternately staggered next to one another in the housing body. This arrangement of the optoelectronic semiconductor chips in the body of the housing also allows the conductor tracks to be arranged in a straight line and parallel to one another on the circuit board, which in turn allows the first optoelectronic component and the second optoelectronic component to be arranged side by side on the circuit board, in such a manner that the corresponding optoelectronic semiconductor chips of the two optoelectronic components are connected in parallel.

In an embodiment of the circuit assembly, a transparent conductive layer is arranged on the upper face of the housing body of the first optoelectronic component. The transparent conductive layer is advantageously provided for electrically contacting contact pads arranged on the upper faces of the optoelectronic semiconductor chip of the first optoelectronic component.

In an embodiment of the optoelectronic circuit assembly, a contact element is arranged in the housing body of the first optoelectronic component to provide a conductive connection between the upper face and lower face of the housing body. The contact element is connected to an additional conductor track on the circuit board in an electrically conductive manner. Advantageously, the contact element carries an electrically conductive connection of the additional conductor track to the upper face of the housing body of the first optoelectronic component. This enables an electrical contacting of contact pads arranged on the upper faces of the optoelectronic semiconductor chip of the first optoelectronic component.

In an embodiment of the optoelectronic circuit assembly, the contact element is arranged in a row with the optoelectronic semiconductor chips in the housing body of the first optoelectronic component. This advantageously allows the two optoelectronic components to be arranged side by side on the circuit board in such a manner that the optoelectronic semiconductor chips of the two optoelectronic components that correspond to each other are each electrically connected in parallel.

A method for repair is used to repair an optoelectronic circuit assembly having a first optoelectronic component that comprises a housing body, in which a first optoelectronic semiconductor chip and a second optoelectronic semiconductor chip are embedded. The first optoelectronic component is arranged on a circuit board. The first optoelectronic semiconductor chip of the first optoelectronic component is connected to a first conductor track in an electrically conductive manner. The second optoelectronic semiconductor chip of the first optoelectronic component is connected to a second conductor track in an electrically conductive manner. The first optoelectronic semiconductor chip or the second optoelectronic semiconductor chip is defective. The method for repairing provides that a second optoelectronic component is provided, which comprises a housing body in which a first optoelectronic semiconductor chip and a second optoelectronic semiconductor chip are embedded. The second optoelectronic component is mounted on the circuit board such that the first optoelectronic semiconductor chip of the second optoelectronic component is connected to the first conductor track in an electrically conductive manner and the second optoelectronic semiconductor chip of the second optoelectronic component is connected to the second conductor track in an electrically conductive manner. The first optoelectronic component remains on the circuit board.

Advantageously, the optoelectronic circuit assembly is fully functional after this method has been carried out, in spite of the defect in the first optoelectronic semiconductor chip or in the second optoelectronic semiconductor chip of the first optoelectronic component. It is advantageously immaterial to the implementation of the method which and how many of the optoelectronic semiconductor chips of the first optoelectronic component are defective. The method can be carried out in a particularly simple and cost-effective manner due to the fact that the first optoelectronic component remains on the circuit board.

For example, the optoelectronic circuit assembly which is repaired by using the method can form part of a display or a video wall. For example, the optoelectronic circuit assembly can form a pixel of a display device or video wall that comprises a plurality of such pixels. As the number of pixels increases, so does the probability of at least one of the optoelectronic semiconductor chips of the numerous pixels showing a defect. Such a defect could render the entire display or the entire video wall unusable. The possibility of repair resulting from the described method is advantageous in preventing this.

The repair method described may allow less thorough, and therefore more cost-effective, testing to be carried out in the pre-selection of the optoelectronic semiconductor chips used to produce the optoelectronic components and/or in the pre-selection of the optoelectronic components used to produce the optoelectronic circuit assembly. For example, the optoelectronic semiconductor chips used can be tested on a sampled basis only, rather than the entire set. In the event of a defect found after the production of the optoelectronic circuit assembly, a repair can be carried out by means of the method described.

In an embodiment of the method, a conductor track section of the conductor track arranged between the first optoelectronic component and the second optoelectronic component, to which the defective optoelectronic semiconductor chip is connected, is severed. The conductor track can be severed by means of laser radiation, for example. This will advantageously prevent electrical current from flowing through the defective optoelectronic semiconductor chip in the event of a short circuit in the defective optoelectronic semiconductor chip.

In an embodiment of the method the defective optoelectronic semiconductor chip is electrically passivated. For example, the defective optoelectronic semiconductor chip can be made electrically non-conductive by means of laser radiation. Advantageously, this allows a potential short circuit in the defective optoelectronic semiconductor chip to be corrected.

The properties, features and advantages of the present invention described above and the manner in which these are achieved will become clearer and more comprehensible in conjunction with the following description of the exemplary embodiments, which are explained in more detail in connection with the drawings. In the figures, each of which shows a schematic representation.

Figure 1:
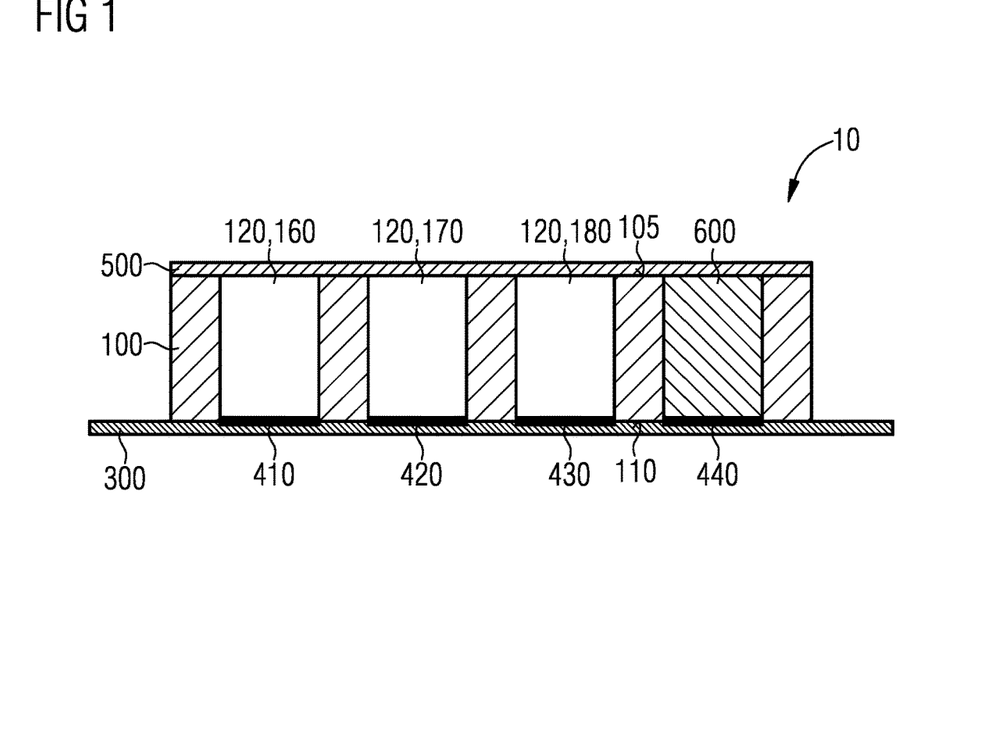
FIG. 1 shows a sectional view through a first optoelectronic component of an optoelectronic circuit assembly.
Figure 2:
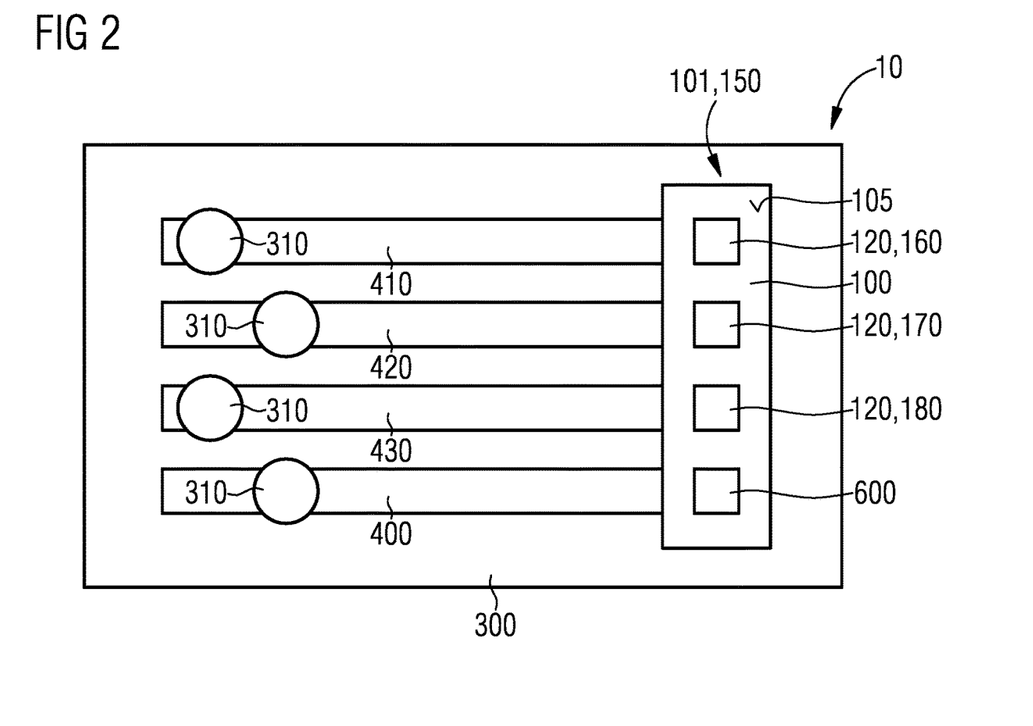
FIG. 2 shows the optoelectronic circuit assembly according to FIG. 1 without a second optoelectronic component.

FIG. 1 shows a sectional view of a design of an optoelectronic circuit assembly 10, which can be part of a display or a video wall, for example. For example, the optoelectronic circuit assembly 10 can form, for example, a picture element (pixel) of a display or a video wall. FIG. 2 shows the optoelectronic circuit assembly 10 of FIG. 1 in a schematic plan view.

The optoelectronic circuit assembly 10 comprises a first optoelectronic component 101. The first optoelectronic component 101 has three optoelectronic semiconductor chips 120, which represent a first optoelectronic semiconductor chip 120, 160, a second optoelectronic semiconductor chip 120, 170 and a third optoelectronic semiconductor chip 120, 180.

The optoelectronic semiconductor chips 120 can each emit light from a specified spectral range. The first optoelectronic component 101 thus forms a first light source 150, which can be an RGB light source, for example. In this case, the optoelectronic semiconductor chips 120 are configured to emit red, green or blue light. This combination of the optoelectronic semiconductor chips 120 is only exemplary, other color combinations also being conceivable. Similarly, the first optoelectronic component 101 may comprise fewer than or more than three optoelectronic semiconductor chips 120.

In this version, all optoelectronic semiconductor chips 120 are arranged side-by-side and equally spaced in a first housing body 100. The first housing body 100 comprises an upper face 105 and a lower face 110 opposite the upper face. The upper and lower faces of the semiconductor chips 120 are not covered by the first housing body 100 but are exposed on the upper face 105 and lower face 110 of the first housing body 100. For example, the first housing body 100 can be formed of epoxy resin.

A contact element 600 is placed next to the third semiconductor chip 180 in the first housing body 100. This creates a conductive connection between the upper face 105 and the lower face 110 of the first 100 housing body. The contact element 600 can be made of metal.

In the example shown in FIGS. 1 and 2 the optoelectronic semiconductor chips 120 and the contact element 600 are arranged in a row next to each other in the first housing body 100. Likewise, the optoelectronic semiconductor chips 120 could be arranged staggered alternately side by side in the first housing body 100. In the drawing of FIG. 2, this could be achieved by displacing the first semiconductor chip 160 and the third semiconductor chip 180 to the right with respect to the second semiconductor chip 170.

The optoelectronic semiconductor chips 120 each have an electrical contact pad on each of their upper faces and their lower faces. These contact pads allow the optoelectronic semiconductor chips 120 to be energized with electric current. In a variant not shown, the lower faces of the semiconductor chips 120 are not exposed on the lower face 110 of the first housing body 100, but are connected in an electrically conductive manner to contact pads arranged on the lower face 110 of the first housing body 100.

On the upper face 105 of the first housing body 100 a transparent conductive layer 500 is provided over the entire length of the first housing body 100. The transparent conductive layer 500 may be formed of indium tin oxide or any other material that is transparent in visible light. The contact pads on the upper faces of the optoelectronic semiconductor chips 120 are connected to each other and to the contact element 600 in an electrically conductive manner via the conductive layer 500.

The optoelectronic circuit assembly 10 comprises a circuit board 300, which can be configured as a PCB (printed circuit board), for example. On the circuit board 300, a first conductor track 410, a second conductor track 420, a third conductor track 430 and a fourth conductor track 400 are each arranged parallel to each other in straight lines. The four conductor tracks 400, 410, 420, 430 are each contacted via a plated-through hole 310 extending through the circuit board 300. However, it is also possible to design the system without the plated-through holes 310.

The first housing body 100 of the first optoelectronic component 101 is arranged with its lower face 110 on the circuit board 300 in such a way that the contact pads on the lower faces of the optoelectronic semiconductor chip 120 and the contact element 600 are in contact with the conductor tracks 400, 410, 420, 430. The first conductor track 410 is connected to the contact pad on the lower face of the first optoelectronic semiconductor chip 160, the second conductor track 420 is connected to the contact pad on the lower face of the second optoelectronic semiconductor chip 170 and the third conductor track 430 is connected to the contact pad on the lower face of the third optoelectronic semiconductor chip 180. The fourth conductor track 400 is connected to the contact element 600. The contact pads on the upper faces of the optoelectronic semiconductor chips 120 are thereby connected to the conductor track 400 via the conductive layer 500 and the contact element 600 in an electrically conductive manner. This means that each of the optoelectronic semiconductor chips 120 can be independently controlled and supplied with electric current. The first light source 150 formed by the first optoelectronic component 101 is thereby configured to emit light of an adjustable color.

If one of the three optoelectronic semiconductor chips 120 of the first optoelectronic component 101 has a defect, the first light source 150 will then no longer be able to emit light of all intended colors. This can render the optoelectronic circuit assembly 10 unusable. Therefore, in the following a method is described for repairing the optoelectronic circuit assembly 10 in such a case.

Figure 3:
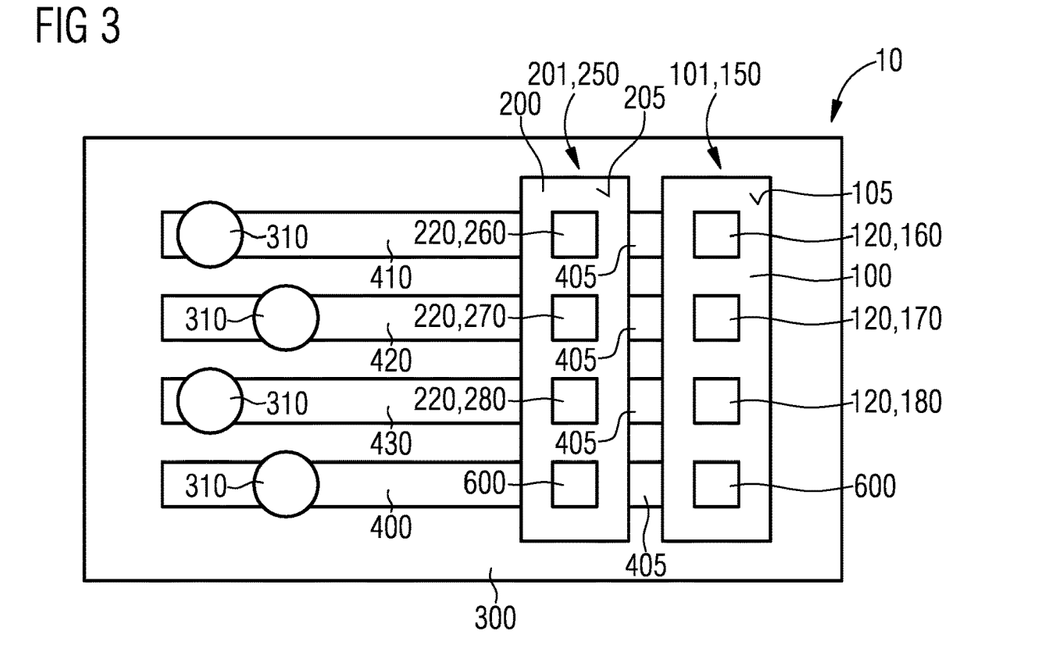
FIG. 3 shows an optoelectronic circuit assembly after a first repair step.

FIG. 3 shows the optoelectronic circuit assembly 10 in a schematic plan view after a first repair step. A second optoelectronic component 201 has been mounted on the circuit board 300 parallel to the first optoelectronic component 101.

The second optoelectronic component 201 has the same design as the first optoelectronic component 101. This means that the second optoelectronic component 201 also has three optoelectronic semiconductor chips 120, namely a first optoelectronic semiconductor chip 120, 260, a second optoelectronic semiconductor chip 120, 270 and a third optoelectronic semiconductor chip 120, 280. These form a second light source 250. The first optoelectronic semiconductor chip 260 of the second optoelectronic component 201 is configured in the same way as the first optoelectronic semiconductor chip 160 of the first optoelectronic component 101. The second optoelectronic semiconductor chip 270 of the second optoelectronic component 201 is configured in the same way as the second optoelectronic semiconductor chip 170 of the first optoelectronic component 101. The third optoelectronic semiconductor chip 280 of the second optoelectronic component 201 is configured in the same way as the third optoelectronic semiconductor chip 180 of the first optoelectronic component 101.

The optoelectronic semiconductor chips 120 of the second optoelectronic component 201 are embedded in a second housing body 200 with an upper face 205 and a lower face 210.

The optoelectronic circuit assembly 10 is designed in such a way that a free space exists on the circuit board 300 between the plated-through holes 310 and the first housing body 100 of the first optoelectronic component 101 for the conductor tracks 400, 410, 420, 430 to pass through. If the optoelectronic circuit assembly 10 is designed without the plated-through holes 310, the free space is formed on one side next to the first optoelectronic component 101, wherein the conductor tracks 400, 410, 420, 430 pass through this free space.

The second optoelectronic component 201 with the second light source 250 has been arranged on the free space between the plated-through holes 310 and the first optoelectronic component 101. A gap is left between the two optoelectronic components 101, 201. Equally, the two optoelectronic components 101, 201 could be mounted side by side on the circuit board 300 without a gap.

The two optoelectronic components 101, 201 have been placed on the circuit board 300 in such a way that the first optoelectronic semiconductor chip 160 of the first optoelectronic component 101 and the first optoelectronic semiconductor chip 260 of the second optoelectronic component 201 are both contacted via the first conductor track 410. Accordingly, the second optoelectronic semiconductor chip 170 of the first optoelectronic component 101 and the second optoelectronic semiconductor chip 270 of the second optoelectronic component 201 are both contacted via the second conductor track 420, and the third optoelectronic semiconductor chip 180 of the first optoelectronic component 101 and the third optoelectronic semiconductor chip 280 of the second optoelectronic component 201 are both contacted via the third conductor track 430. The contact elements 600 of both optoelectronic components 101, 201 are connected to the fourth conductor track 400.

The first two optoelectronic semiconductor chips 160, 260 thus form a parallel circuit. Similarly, the second optoelectronic semiconductor chips 170, 270 are connected in parallel and the third optoelectronic semiconductor chips 180, 280 are connected in parallel also.

For example, if the first optoelectronic semiconductor chip 160 of the first optoelectronic component 101 has a defect which prevents an electric current from flowing through the first optoelectronic semiconductor chip 160 of the first optoelectronic component 101 despite an electrical voltage being applied between the first conductor track 410 and the fourth conductor track 400, and the first optoelectronic semiconductor chip 160 of the first optoelectronic component 101 thus emits no light, then the whole of the electrical current flows through the first optoelectronic semiconductor chip 260 of the second optoelectronic component 201 instead. This chip then emits light instead of the first optoelectronic semiconductor chip 160 of the first optoelectronic component 101.

For example, if the second optoelectronic semiconductor chip 170 of the first optoelectronic component 101 has no defect, then when an electrical voltage is applied between the second conductor track 420 and the fourth conductor track 400 an electric current flows through the second optoelectronic semiconductor chip 170 of the first optoelectronic component 101 and through the second optoelectronic semiconductor chip 270 of the second optoelectronic component 201, of approximately half the total current in each case. As a result the second optoelectronic semiconductor chip 170 of the first optoelectronic component 101 and the second optoelectronic semiconductor chip 270 of the second optoelectronic component 201 each emit light at half the brightness. The brightness of the total light emitted by the second optoelectronic semiconductor chips 170, 270 of the first optoelectronic component 101 and the second optoelectronic component 201 therefore corresponds to the case in which only the first optoelectronic component 101 is present.

If the only possible defects that can occur in the optoelectronic semiconductor chips 120 of the first optoelectronic component 101 are such that current can no longer flow through the defective optoelectronic semiconductor chip 120, then the repair is completed in the processing state shown in FIG. 3. The second optoelectronic component 201 fully compensates for defects in one or more of the optoelectronic semiconductor chips 160, 170, 180 of the first optoelectronic component 101. After the second optoelectronic component 201 has been installed, the first optoelectronic component 101 can remain on the printed circuit board 300.

However, it is possible that one of the optoelectronic semiconductor chips 120 of the first optoelectronic component 101 exhibits a defect associated with a short circuit. In this case, electric current can continue to flow through the defective optoelectronic semiconductor chip 120, but this does not light up. In this case, an additional repair step is required to electrically isolate the defective optoelectronic semiconductor chip 120. Based on FIGS. 4 and 5, two ways of achieving this are described below.

Figure 4:
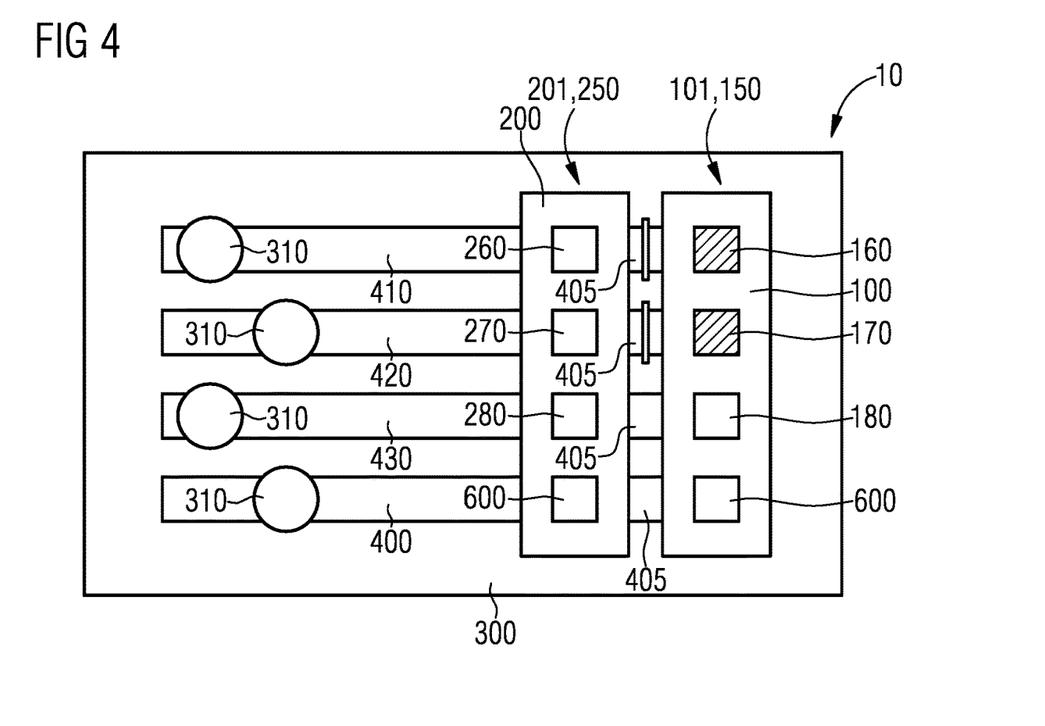
FIG. 4 shows the optoelectronic circuit assembly according to FIG. 3 after a further repair step.

FIG. 4 shows the optoelectronic circuit assembly 10 in a schematic plan view in a processing state that follows the drawing of FIG. 3. In the example shown, it is assumed that the first optoelectronic semiconductor chip 160 and the second optoelectronic semiconductor chip 170 of the first optoelectronic component 101 are defective.

FIG. 4 shows that conductor track sections 405 of the first conductor track 410 and the second conductor track 420 laid between the first optoelectronic component 101 and the second optoelectronic component 201 have been severed before or after the arrangement of the second optoelectronic component 201 on the circuit board 300. The defective optoelectronic semiconductor chips 160, 170 of the first optoelectronic component 101 are thereby electrically isolated and are no longer connected in parallel with the first optoelectronic semiconductor chip 260 and the second optoelectronic semiconductor chip 270 of the second optoelectronic component 201. This prevents an electric current from flowing through the defective optoelectronic semiconductor chips 160, 170 of the first optoelectronic component 101 if an electrical voltage is applied between the first conductor track 410 and the fourth conductor track 400 or between the second conductor track 420 and the fourth conductor track 400. Instead, the entire electric current flows through the first optoelectronic semiconductor chip 260 or the second optoelectronic semiconductor chip 270 of the second optoelectronic component 201, which then lights up at full brightness.

It would be possible also to sever the conductor track section 405 of the third conductor track 430 between the third optoelectronic semiconductor chip 180 of the first optoelectronic component 101 and the third optoelectronic semiconductor chip 280 of the second optoelectronic component 201, although the third optoelectronic semiconductor chip 180 of the first optoelectronic component 101 is not defective. Additionally or alternatively, the conductor track section 405 of the fourth conductor track 400 can be severed between the contact element 600 of the first optoelectronic component 101 and the contact element 600 of the second optoelectronic component 201. In this case, the first optoelectronic component 101 is completely electrically isolated. Its function is then performed entirely by the second optoelectronic component 201. In either case the first optoelectronic component 101 can remain on the circuit board 300.

The conductor track sections 405 can be cut by means of laser radiation, for example.

Figure 5:
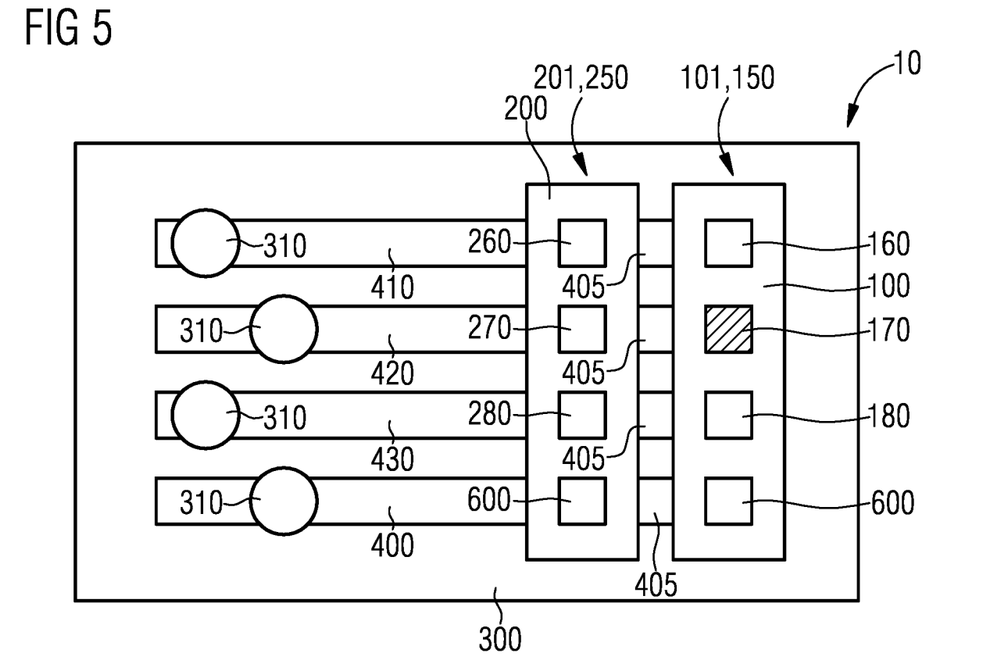
FIG. 5 shows the optoelectronic circuit assembly according to FIG. 3 after a second or alternative repair step to FIG. 4.

FIG. 5 shows the optoelectronic circuit assembly 10 in a schematic plan view in a processing state following that illustrated in FIG. 3 after the completion of another repair step, which is an alternative to the repair step described in FIG. 4. In the example shown, it is assumed that the second optoelectronic semiconductor chip 170 of the first optoelectronic component 101 is defective.

The defective second optoelectronic semiconductor chip 170 of the first optoelectronic component 101 has been electrically passivated before or after the installation of the second optoelectronic component 201 and thus rendered non-conducting. As a result, the second optoelectronic semiconductor chip 170 of the first optoelectronic component 101 is not connected in parallel with the second optoelectronic semiconductor chip 270 of the second optoelectronic component 201. If an electrical voltage is applied between the second conductor track 420 and the fourth conductor track 400, an electric current flows only through the second optoelectronic semiconductor chip 270 of the second optoelectronic component 201, which then lights up at full brightness. The first optoelectronic component 101 can remain on the circuit board 300.

The passivation of the second optoelectronic semiconductor chip 170 can be carried out by means of laser radiation, for example. To do so, for example, an epitaxial layer of the second optoelectronic semiconductor chip 170 may have been partially or completely severed or otherwise destroyed. Passivation may also have comprised arranging an electrically insulating passivation layer on the second optoelectronic semiconductor chip 170.

Again, it would be possible also to passivate the first optoelectronic semiconductor chip 160 and the third optoelectronic semiconductor chip 180 of the first optoelectronic component 101 and make them non-conducting, even if they were not defective.

The repair operations described in FIGS. 4 and 5 can also be combined.

The invention has been illustrated and described in more detail based on the preferred exemplary embodiments. However, the invention is not limited to the examples disclosed. On the contrary, other variations can be derived from them by the person skilled in the art without departing from the scope of protection of the invention.

LIST OF REFERENCE SIGNS

10 optoelectronic circuit assembly
101 first optoelectronic component
100 housing body
105 upper face
110 lower face
120 optoelectronic semiconductor chip
150 first light source
160 first optoelectronic semiconductor chip
170 second optoelectronic semiconductor chip
180 third optoelectronic semiconductor chip
201 second optoelectronic component
200 housing body
205 upper face
210 lower face
250 second light source
260 first optoelectronic semiconductor chip
270 second optoelectronic semiconductor chip
280 third optoelectronic semiconductor chip
300 circuit board
310 plated-through hole
400 fourth conductor track
405 conductor track section
410 first conductor track
420 second conductor track
430 third conductor track
500 conductive layer
600 contact element

The invention claimed is:

1. An optoelectronic circuit assembly comprising:
a first optoelectronic component and a second optoelectronic component,
wherein the optoelectronic components each comprise a housing body with an upper face and a lower face,
wherein, in the housing body of each optoelectronic component, a first optoelectronic semiconductor chip and a second optoelectronic semiconductor chip are embedded,
wherein the optoelectronic components are mounted on a circuit board,
wherein the first optoelectronic semiconductor chip of the first optoelectronic component and the first optoelectronic semiconductor chip of the second optoelectronic component are connected to a first conductor track in an electrically conductive manner,
wherein the second optoelectronic semiconductor chip of the first optoelectronic component and the second optoelectronic semiconductor chip of the second optoelectronic component are connected to a second conductor track in an electrically conductive manner, and
wherein the first optoelectronic semiconductor chip or the second optoelectronic semiconductor chip of the first optoelectronic component is defective.

2. The optoelectronic circuit assembly according to claim 1, wherein the first optoelectronic component and the second optoelectronic component comprise the same design.

3. The optoelectronic circuit assembly according to claim 1, wherein the optoelectronic components each comprise a third optoelectronic semiconductor chip.

4. The optoelectronic circuit assembly according to claim 1, wherein a conductor track section of the conductor track connected to the defective optoelectronic semiconductor chip is severed between the first optoelectronic component and the second optoelectronic component.

5. The optoelectronic circuit assembly according to claim 1, wherein the defective optoelectronic semiconductor chip is electrically passivated.

6. The optoelectronic circuit assembly according to claim 1, wherein the first optoelectronic component and the second optoelectronic component are arranged parallel to each other on the circuit board.

7. The optoelectronic circuit assembly according to claim 1, wherein the optoelectronic semiconductor chips of the first optoelectronic component are arranged in a row in the housing body.

8. The optoelectronic circuit assembly according to claim 1, wherein the optoelectronic semiconductor chips of the first optoelectronic component are arranged below one another and alternately staggered next to one another in the housing body.

9. The optoelectronic circuit assembly according to claim 1, wherein a transparent conductive layer is arranged on the upper face of the housing body of the first optoelectronic component.

10. The optoelectronic circuit assembly according to claim 1, wherein a contact element is arranged in the housing body of the first optoelectronic component and provides a conductive connection between the upper face and the lower face of the housing body, and wherein the contact element is connected to a further conductor track in an electrically conductive manner.

11. The optoelectronic circuit assembly according to claim 10, wherein the contact element is arranged in a row with the optoelectronic semiconductor chips in the housing body of the first optoelectronic component.

12. A method for repairing an optoelectronic circuit assembly, the method compriing:
  embedding a first optoelectronic semiconductor chip and a second optoelectronic semiconductor chip into a first housing body, a first optoelectronic component comprising the first housing body,
  wherein the first optoelectronic component is arranged on a circuit board, the first optoelectronic semiconductor chip of the first optoelectronic component is connected to a first conductor track in an electrically conductive manner and the second optoelectronic semiconductor chip of the first optoelectronic component is connected to a second conductor track in an electrically conductive manner, and
  wherein the first optoelectronic semiconductor chip or the second optoelectronic semiconductor chip of the first optoelectronic component is defective; and
  embedding a first optoelectronic semiconductor chip and a second optoelectronic semiconductor chip into a second housing body, a second optoelectronic component comprising the second housing body,
  wherein the second optoelectronic component is mounted on the circuit board such that the first optoelectronic semiconductor chip of the second optoelectronic component is connected to the first conductor track in an electrically conductive manner and the second optoelectronic semiconductor chip of the second optoelectronic component is connected to the second conductor track in an electrically conductive manner, and wherein the first optoelectronic component remains on the circuit board.

13. The method according to claim 12, wherein a conductor track section of the conductor track, arranged between the first optoelectronic component and the second optoelectronic component and to which the defective optoelectronic semiconductor chip is connected, is severed.

14. The method according to claim 12, wherein the defective optoelectronic semiconductor chip is rendered electrically non-conducting by laser radiation.

* * * * *